(12) United States Patent
Pappas

(10) Patent No.: US 6,548,104 B2
(45) Date of Patent: Apr. 15, 2003

(54) APPARATUS AND METHOD FOR COATING PROSTHETIC COMPONENTS

(76) Inventor: Michael J. Pappas, 61 Gould Pl., Caldwell, NJ (US) 07006

(*) Notice: Subject to any disclaimer, the term of this patent is extended or adjusted under 35 U.S.C. 154(b) by 0 days.

(21) Appl. No.: 09/805,399

(22) Filed: Mar. 12, 2001

(65) Prior Publication Data
US 2001/0023662 A1 Sep. 27, 2001

Related U.S. Application Data

(60) Provisional application No. 60/190,998, filed on Mar. 21, 2000.

(51) Int. Cl.[7] .......................... A61L 27/06; A61L 27/04; B05D 1/04
(52) U.S. Cl. .................. 427/2.26; 427/2.24; 427/2.28; 427/240; 427/241; 427/242; 427/248.1; 427/250; 427/252; 427/255.1; 427/255.2; 427/255.5; 427/457; 427/472; 427/295
(58) Field of Search .................... 427/2.26, 240, 427/241, 242, 248.1, 250, 251, 252, 255.1, 255.2, 255.5, 457, 472, 295, 2.24, 2.28

(56) References Cited

U.S. PATENT DOCUMENTS 4,511,593 A * 4/1985 Brandolf ................. 118/50.1
5,520,664 A * 5/1996 Bricault et al. ............. 604/174
5,545,227 A * 8/1996 Davidson et al. ........ 623/23.53
5,702,448 A 12/1997 Buechel et al.
5,861,042 A 1/1999 Buechel et al.
5,868,796 A 2/1999 Buechel et al.

FOREIGN PATENT DOCUMENTS

EP 0 729 173 A1 8/1996
EP 0 847 735 A2 6/1998
GB 2 323 855 10/1998

* cited by examiner

Primary Examiner—Shrive P. Beck
Assistant Examiner—Jennifer Kolb Michener
(74) Attorney, Agent, or Firm—Gerald E. Hespos; Anthony J. Casella

(57) ABSTRACT

A physical vapor deposition apparatus and process are provided for providing a highly smooth shiny coating to a substrate. The apparatus includes a chamber with a fixture for mounting the components to be coated. The fixture is arranged such that the surfaces to be coated define a "dark side" that faces away from the source of ion bombardment. With this arrangement, heavier multiple ions will travel past the surface to be coated. Lighter single ions will be drawn more readily to the oppositely charged surface to be coated, and hence will undergo a non-linear travel path for deposition onto the component.

4 Claims, 3 Drawing Sheets

APPARATUS AND METHOD FOR COATING PROSTHETIC COMPONENTS

This application claims the benefit of Provisional Patent Application No. 60/190,998 filed Mar. 21, 2000.

BACKGROUND OF THE INVENTION

1. Field of the Invention

The subject invention relates to a method and apparatus for coating prosthetic components to achieve a uniform shiny smooth coating that will exhibit exceptional wear when placed in articular or sliding bearing engagement with another prosthetic component.

2. Description of the Related Art

Orthopedic prosthetic joints are used to replace at least portions of a diseased or damaged natural joint between at least two bones of a patient. A total joint replacement typically involves accessing the diseased or damaged joint and resecting opposed ends of the bone that form the joint. Metallic components then are affixed to the resected ends of the bones.

Metal on metal sliding or articular contact is known to produce molecular or chemical reactions that generate wear debris and degrade the performance of the prosthetic joint. As a result, the typical prior art prosthetic joint is designed to have metallic components of the prior art prosthetic joint articulate or slide against a non-metallic component. For example, plastic bearings may be incorporated into a joint for sliding and/or articular bearing engagement with the metallic components of the joint. The plastic bearing should be hard, wear resistant and chemically inert in the presence of the biological fluids. Many prior art prosthetic joints employ bearings made of an ultra high molecular weight polyethylene (UHMWPe). The UHMWPe bearing will not cause the chemical reactions that occur when metallic components slide against one another. However, UHMWPe bearings can wear if the metallic part that slides against the bearing is rough. In view of the above, it is important to provide very smooth surfaces for articulation or sliding against a UHMWPe bearing.

Many prosthetic joints employ metallic components formed from alloys of titanium or cobalt-chromium. Cobalt chromium alloys are very hard and strong and exhibit appropriate flexure. However, cobalt chromium also is very expensive and many patients exhibit sensitivity to cobalt-chromium alloys. Titanium alloys, such as titanium aluminum vanadium alloys also exhibit appropriate strength and flexure. Additionally, patients are less likely to exhibit sensitivity to titanium alloys, and titanium alloys are less expensive than cobalt-chromium alloys. However, titanium alloys generally are not as hard as cobalt chromium alloys. As a result, articulating surfaces of prosthetic components formed from titanium alloys typically are provided with a thin ceramic coating. For example, the articular surfaces of a titanium alloy prosthetic component may be provided with a titanium nitride (TiN) coating.

Ceramic coatings typically have been applied to metallic alloy substrates by known physical vapor deposition processes. This technology is widely used, for example, in the machine tool art to enhance the life of cutting tools. Prior art physical vapor deposition technology-typically applies the coating to a substrate in a vacuum coating chamber. A charge is applied to the substrate to be coated in the chamber, while an opposite charge is applied to the material to be coated onto the substrate. An arc is struck in the chamber, and the substrate to be coated is subjected to high energy ion bombardment. A gas then is introduced into the chamber. The gas reacts with the ions of the cathode and produces an ionic deposition of a highly-adherent ceramic coating onto the substrate.

FIG. 1 hereto schematically illustrates the prior art vacuum coating chamber for applying a TiN coating to a titanium alloy prosthetic component. In particular, FIG. 1 shows a vacuum chamber 10 having a plurality of surface-mountable femoral components 12 for replacement hips. Each femoral component 12 includes a mounting stem 14 that will be mounted in a mounting aperture formed in the resected proximal end of the femur. The femoral component 12 further includes a head 16 having a convex bearing surface 18 and an opposed concave surface (not shown) for nesting tightly over the resected proximal end of the femur. The convex bearing surface 18 of the femoral component 12 will be in articular bearing engagement with a plastic bearing liner of the acetabular component of the hip prosthesis. The plastic bearing liner typically will be formed from UHMWPe. The prior art vacuum chamber 10 is employed to impart a TiN coating to the convex articular bearing surface 18 of the prior art femoral component 12. As noted above, the coating must be hard to prevent wear of the coating and must be smooth to prevent wear of the UHMWPe bearing against which the femoral component 12 will articulate.

In an effort to achieve uniform coating, the prior art chamber includes a fixture 20 that extends into the prior art chamber 10. The prior art fixture 20 is in a substantially central position within the prior art chamber 10 and is constructed to permit the femoral components 12 to be mounted thereon such that the convex articular bearing surfaces 18 of the femoral components 12 face outwardly and away from fixture 20. The prior art fixture 20 is mounted to a power supply 22 disposed externally of the prior art chamber 10. The power supply 22 imparts a charge to the fixture and to the femoral components 12 in the prior art chamber 10. The power supply 22 further functions to rotate the prior art fixture 20 within the prior art chamber 10 in an effort to achieve uniform coating on the convex bearing surfaces 18 of the prosthetic components 12.

The prior art chamber 10 further includes titanium evaporator 24 mounted in the walls of the chamber 10 and facing the prosthetic components 12. A charge is applied to the evaporators 24 that is opposite to the charge applied to the fixture 20. An arc then is struck in the chamber 10 and the convex articular bearing surfaces 18 of the prosthetic components 12 are subject to an ionic bombardment. Nitrogen gas is introduced into the chamber 10. The gas reacts with the ions and produces an ionic deposition of a highly-adherent ceramic TiN coating onto the articular bearing surfaces 18 of the prosthetic components 12.

Conventional wisdom, as practiced in the prior art, is to employ the prior art fixture 20 with the articular bearing surfaces 18 of the prosthetic components 12 facing the evaporators 24 in an effort to achieve optimum coating.

It recently was observed by the applicant herein that parts produced by the above-described prior art chamber 10 were slightly dull at certain locations and shinier in other locations. Analysis was conducted to determine the reason for the different appearances at different locations on the bearing surfaces 18 of the prosthetic components 12. It was determined that the improperly coated prosthetic components were not properly rotated in the prior art chamber 10, and thus one side was not directly exposed to the ion bombardment. Dull regions on the improperly coated prosthetic components 12 were determined to be attributable to very small droplets formed on the prosthetic components 12. The droplets form an asperity on the bearing surface 18 which would increase wear against UHMWPe bearings.

Accordingly, it is an object of the subject invention to provide a coating apparatus and process that will limit asperity and thereby provide a bearing surface with excellent wear characteristics.

SUMMARY OF THE INVENTION

The above-described malfunctioning apparatus demonstrated that one side of the prosthetic component in the prior art chamber with the malfunctioning fixture had a high quality coating, while the opposed side had an inferior coating. In an effort to determine which sides of the prosthetic components achieved the better coating, a chamber was developed which fixtured the prosthetic components so that the surface that required a smooth hard coating would define the "dark side" of the chamber. Thus, the fixtures were arranged so that the convex articular bearing surfaces of the prosthetic components faced away from the evaporators and toward the center of the chamber. Each individual component's surface to be coated, or "dark side", faces away from its most proximal evaporator so as to be shielded from the direct straight line-of-sight path from the cathode to the surface. Contrary to conventional wisdom and contrary to the practice in the prior art, it was determined by the applicant that prosthetic components that have been fixtured with the surface to be coated facing away from the evaporator in this fashion, and hence defining the "dark side", achieves a uniformly shiny coated surface. Furthermore, it has been determined that the coating achieved by this process and in this chamber is substantially free of the small droplets that are provided with prior art coating processes and chambers and exhibit superior wear characteristics particularly against UHMWPe.

It is believed that the physical vapor deposition process produces both single ions and double or multiple ions within the chamber. The multiple ions, of course, have greater mass and will produce the above-described small droplets and corresponding unevenness on the surface of the prosthetic component to be coated. When the side to be coated defines the "dark side" and faces away from the most proximal ion source, the momentum attributable to the higher mass multiple ions cause those heavier ions to travel substantially linearly past the "dark side" surface to be coated. However, the lower mass single ions are more likely to travel through a curved path and be attracted by the oppositely charged prosthetic components facing away from the most proximal titanium anode. Thus, only single ions are deposited on the "dark side" surface that requires the smooth coating. Although this "dark side" coating process takes longer, the results have proven to be superior with a very smooth coating substantially free of droplets that had been present in the prior art. As a result, prosthetic components formed by the subject apparatus and accordance with the process described herein do not require extensive polishing and achieve superior wear when in articular bearing engagement with a UHMWPe bearing.

DETAILED DESCRIPTION OF THE PREFERRED EMBODIMENT

Figure 2:
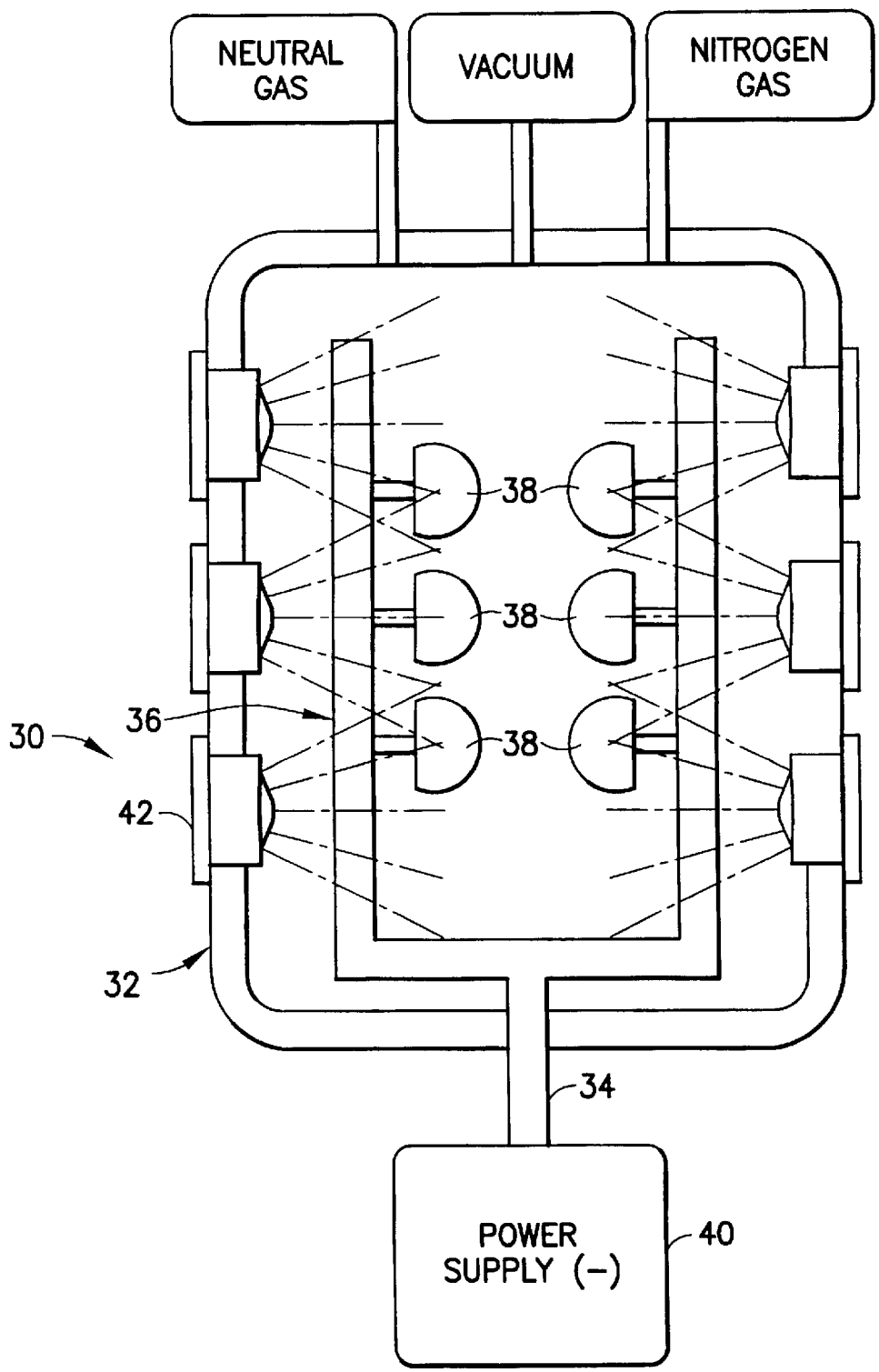
FIG. 2 is a schematic diagram of a physical vapor deposition apparatus in accordance with the subject invention.

A physical vapor deposition apparatus in accordance with the subject invention is identified generally by the numeral 30 in FIG. 2. The apparatus 30 includes a chamber 32 having a fixture 34 mounted therein. The fixture 34 is configured so that a plurality of prosthetic components 36 is mounted thereto. Each prosthetic component 36 has a convex articular bearing surface 38 facing inwardly to a central position within the chamber 32. This particular orientation of the convex articular bearing surface 38 is thus shielded from the direct straight line-of-sight path from the proximal titanium evaporator. The fixture 34 extends to a power supply 40 disposed externally of the chamber 32. The power supply 40 is operative to impose a charge on the fixture 34 and on the prosthetic components 36 and to rotate the fixture 34 within the chamber 32.

The physical vapor deposition apparatus 30 further includes a plurality of evaporators 42 facing into the chamber 32. However, as shown most clearly in FIG. 2, the surfaces 38 of the prosthetic components 36 to be coated face away from their most proximal evaporators 42 and toward the central position of the chamber 32.

Figure 1:
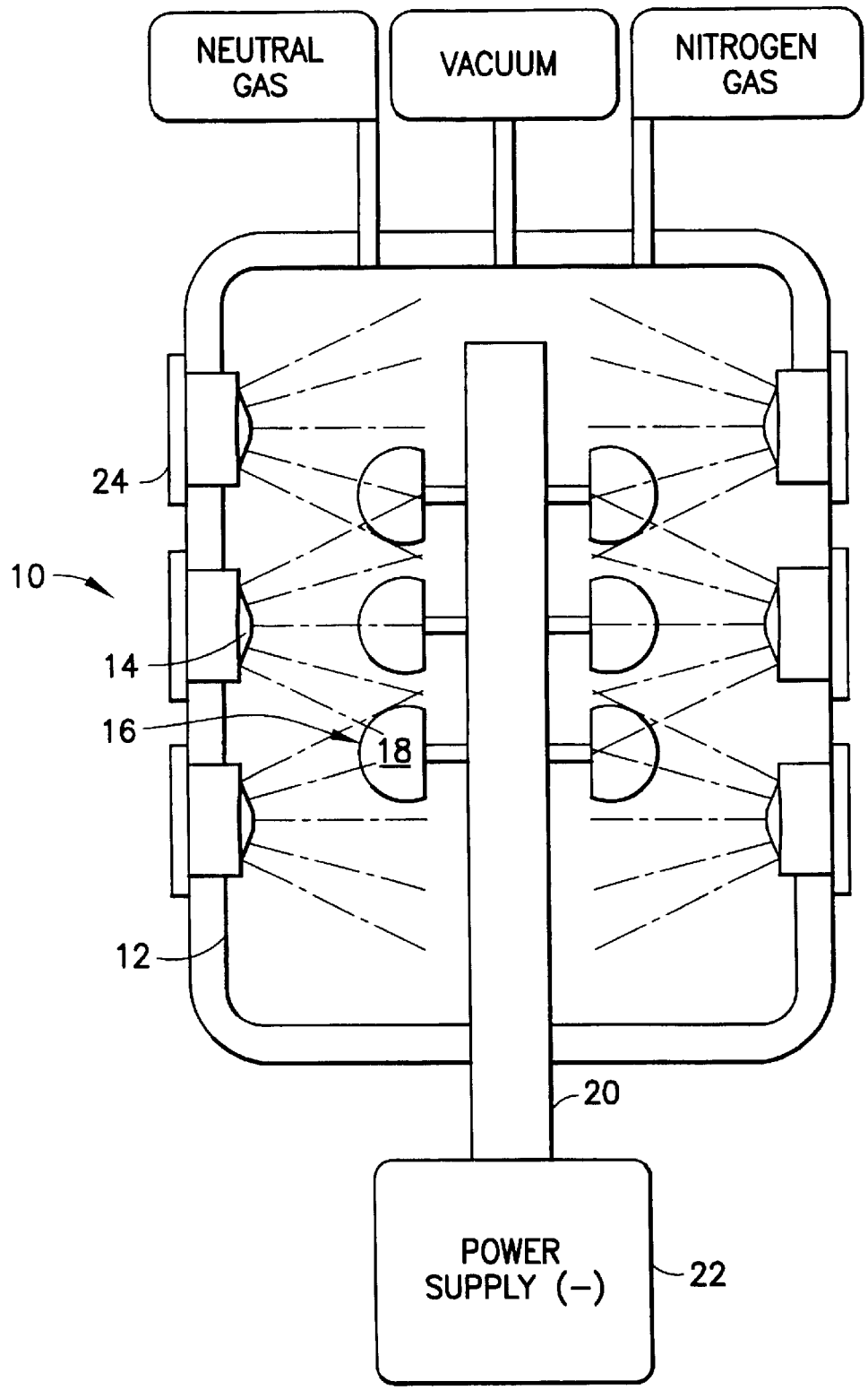
FIG. 1 is a schematic view of a prior art physical vapor deposition chamber.
Figure 3:
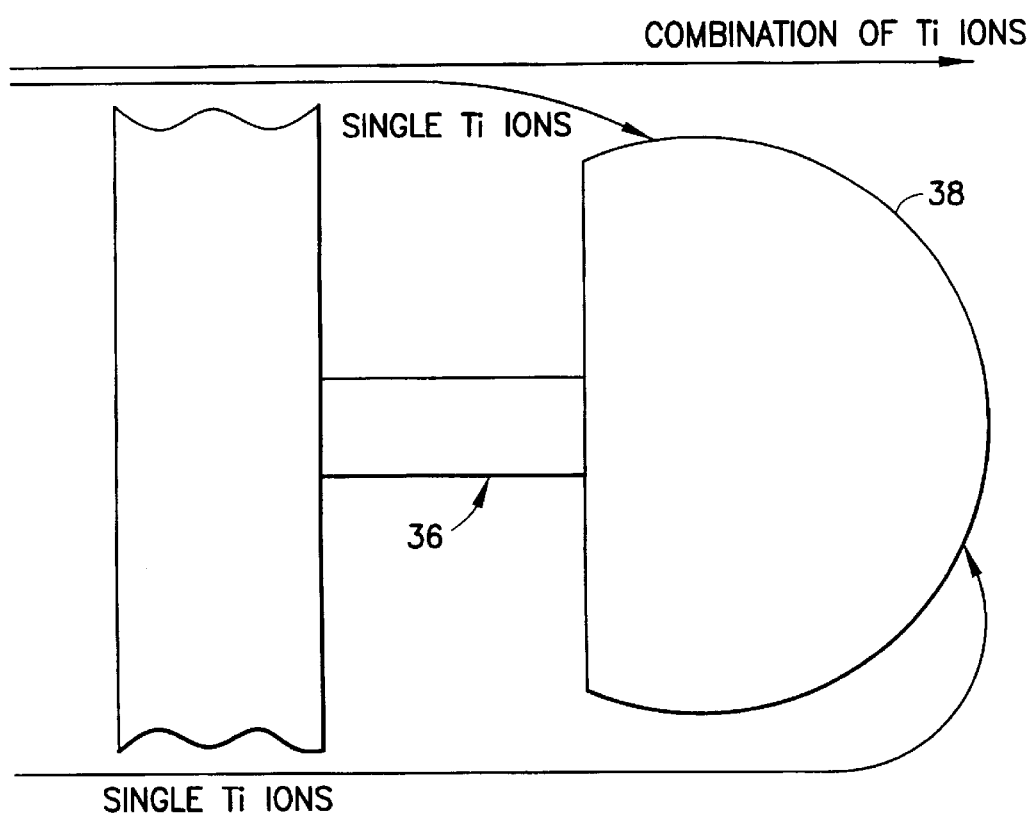
FIG. 3 is a schematic view showing a single prosthetic component in the apparatus of FIG. 2 and illustrating paths taken by single titanium ions versus those by combinations of titanium ions.

The apparatus 30 is operated substantially in the same manner as the prior art apparatus. In particular, a charge is applied to the evaporators 42 that is, opposite the charge applied to the prosthetic components 36, and an arc is struck in the chamber to create a titanium ion bombardment. Additionally, a nitrogen gas is introduced into the chamber. Nitrogen gas reacts with the titanium ions and produces an ionic deposition of a highly adherent TiN coating. As shown in FIG. 3, the ions produced by the evaporators 42 include single TiN ions and combinations of TiN ions. The combinations of ions, such as double ions, will have greater mass, and hence will travel in a more nearly straight line due to momentum resulting from the greater mass. The single ions, however, have lower mass and less momentum. These single TIN ions will be more likely to travel through a curved path due to attraction forces between the prosthetic components 36 and the oppositely charged single TiN ions. Thus, as shown in FIG. 3, the single TiN ions will travel through a curved path and will be deposited on the "dark side" of the prosthetic components 36 facing away from their most proximal evaporators 42. This process reduces the deposition rate because many ions miss the part entirely. Thus, the deposition process is somewhat more expensive than the direct coating process of the prior art as illustrated schematically in FIG. 1. However, the deposition process produces a smoother and shiner surface than the prior art process and also produces superior wear characteristics of the prosthetic component 36 against a UHMWPe bearing component. path due to attraction forces between the prosthetic components 36 and the oppositely charged single TiN ions. Thus, as shown in FIG. 3, the single TiN ions will travel through a curved path and will be deposited on the "dark side" of the prosthetic components 36 facing away from the evaporators 42. This process reduces the deposition rate because many ions miss the part entirely. Thus, the deposition process is somewhat more expensive than the direct coating process of the prior art as illustrated schematically in FIG. 1. However, the deposition process produces a smoother and shiner surface than the prior art process and also produces superior wear characteristics of the prosthetic component 36 against a UHMWPe bearing component.

While the invention has been described with respect to certain preferred embodiments, it is apparent that various changes can be made without departing from the scope of the invention as defined by the claims. For example, the illustrated embodiments show the mounting of femoral components to the fixture in the physical vapor deposition chamber. However, any other prosthetic components that require coating can be coated in accordance with the subject process and apparatus. Additionally, the fixtures and the specific locations of the evaporators can be varied from the arrangement shown in FIGS. 2 and 3. These and other changes will be apparent to a person skilled in the art after having read the subject disclosure.

What is claimed is:

1. A process for imparting a uniform coating on at least a selected surface of a plurality of prosthetic components, said selected surface being less than the entire surface of each said component, the process comprising:

providing a chamber having a plurality of titanium alloy evaporators disposed therein;

mounting each of the said components to be coated in the chamber such that each said surface to be coated is shielded from the direct straight line-of-sight path from the most proximal titanium alloy evaporator, is oriented towards the center of said chamber, and each said surface to be coated faces at least one other surface to be coated;

applying opposite charges to the titanium alloy evaporator and to each of the components to be coated for ionically bombarding the components in the chamber; and striking an arc in the chamber for ionically bombarding the components to be coated in said chamber.

2. A process for imparting a uniform coating on at least a selected surface of a plurality of prosthetic components, said selected surface being less than the entire surface of said component, as in claim 1, further including the step of introducing nitrogen gas into the chamber while the components are being coated.

3. A process for imparting a uniform coating on at least a selected surface of a plurality of prosthetic components, said selected surface being less than the entire surface of said component, as in claim 2, wherein the prosthetic components are moved in a circular path within the chamber, while maintaining the surfaces to be coated facing away from the titanium alloy evaporator.

4. A process for imparting a uniform coating on at least a selected surface of a prosthetic component, said selected surface being less than the entire surface of said component, the process comprising the steps of:

providing an elongated cylindrical chamber having at least one titanium alloy evaporator disposed in the side wall thereof;

mounting a plurality of components on a fixturing apparatus disposed within the chamber, with the surfaces of the components to be coated being shielded from the direct straight line-of-sight path from the most proximal titanium alloy evaporator, oriented towards the center of said chamber, and each said surface to be coated faces at least one other surface to be coated;

introducing nitrogen gas into the chamber;

rotating said fixturing apparatus such that the prosthetic components are rotated about the longitudinal axis of said chamber;

applying opposite charges to the titanium alloy evaporator and to the components to be coated for attracting ions to the surface of the components; and striking an arc for ionically bombarding the components in the chamber, with the ionic bombardment being of titanium ions including single TiN ions and combinations of TiN ions, with the single TiN ions having a lower mass and less momentum such that the single TiN ions are more likely to being induced by the attraction forces to being deposited on said surfaces of the components facing away from the titanium alloy evaporator thereby resulting in smoother and shinier coatings that produce superior wear characteristics of the prosthetic components.

* * * * *